(12) United States Patent
Zou et al.

(10) Patent No.: US 10,720,893 B2
(45) Date of Patent: Jul. 21, 2020

(54) MICROPHONE ARRAY

(71) Applicant: TDK Electronics AG, München (DE)

(72) Inventors: Lei Zou, København (DK); Henning Petersen, Allerød (DK); Gino Rocca, Copenhagen (DK)

(73) Assignee: TDK Electronics AG, Munich (DE)

( * ) Notice: Subject to any disclaimer, the term of this patent is extended or adjusted under 35 U.S.C. 154(b) by 55 days.

(21) Appl. No.: 16/368,547

(22) Filed: Mar. 28, 2019

(65) Prior Publication Data
US 2019/0305735 A1 Oct. 3, 2019

(51) Int. Cl.
| | |
|---|---|
| *H03F 3/183* | (2006.01) |
| *G05F 1/56* | (2006.01) |
| *H04R 1/40* | (2006.01) |
| *H02M 3/04* | (2006.01) |

(52) U.S. Cl.
CPC .............. *H03F 3/183* (2013.01); *G05F 1/56* (2013.01); *H02M 3/04* (2013.01); *H04R 1/406* (2013.01); *H03F 2200/03* (2013.01)

(58) Field of Classification Search
None
See application file for complete search history.

(56) References Cited

U.S. PATENT DOCUMENTS

| | | |
|---|---|---|
| 9,915,962 B2 | 3/2018 | Lee et al. |
| 2012/0076316 A1* | 3/2012 | Zhu ................. H04R 3/005 381/71.11 |
| 2016/0118876 A1 | 4/2016 | Oaklander |

FOREIGN PATENT DOCUMENTS

WO          2017192465 A1    11/2017

* cited by examiner

*Primary Examiner* — Paul W Huber

(57) ABSTRACT

A microphone array is disclosed. In an embodiment a microphone array includes a power supply circuit arrangement, at least one microphone circuit and a voltage detector. The power supply arrangement includes a switched-mode power supply circuit configured to generate at least two different levels of output voltage. The at least one microphone circuit includes a microphone transducer, and audio amplifier, a switchable voltage regulator circuit supplying the amplifier. The voltage detector is configured to switch the output voltage of the voltage regulator circuit depending on the voltage supplied by the switched-mode power supply circuit.

14 Claims, 3 Drawing Sheets

MICROPHONE ARRAY

CROSS-REFERENCE TO RELATED APPLICATIONS

This application claims the benefit of German patent application 102018107579.0, filed on Mar. 29, 2018, which application is hereby incorporated herein by reference.

TECHNICAL FIELD

The present disclosure relates to a microphone array. Specifically, the present disclosure relates to a microphone array and its power supply circuit scheme.

BACKGROUND

Microphone arrays are widely used in electronic consumer devices or other systems having a human speech interface to achieve directionality of reception. When the microphone array comprises a multitude of individual microphone circuits that include a MEMS transducer and an audio amplifier, power dissipation becomes an issue.

Each individual microphone circuit arrangement includes a voltage regulator that supplies a constant voltage to the audio amplifier independent of the supply voltage of the system. When battery powered, the supply voltage may vary in a considerable voltage range. The voltage regulator is often a so-called low-dropout (LDO) voltage regulator of which the power dissipation dependents largely on the difference between the input and output voltages. In a microphone array with many microphone circuits the overall power dissipation may be considerable when the battery is fully charged so that a large voltage difference drops at the LDO regulators. The power dissipation in the LDO regulator is converted into heat without performing another useful operational function. Hence, there is a need to reduce the power dissipation in the power supply circuitry of a microphone array.

SUMMARY

Embodiments provide a microphone array that consumes less electrical power.

Further embodiments provide a microphone array that dissipates less heat.

According to an embodiment, a microphone array comprises at least one microphone circuit. In order to realize a directional response several or a multitude of microphone circuits are arranged in array-fashion. A useful number of microphone circuits in an array may range from 5 to 10 or 20 or even more microphone circuits. Each microphone circuit includes a micro-electro-mechanical systems (MEMS) microphone transducer that generates an electrical audio signal in response to acoustic waves received at the sensor. The audio signal from the MEMS microphone transducer is supplied to an audio amplifier to amplify the audio signal and provide it with a suitable voltage swing so that it can be further processed by signal processing circuitry. Further provided in the microphone circuit is a voltage regulator circuit that supplies electrical power to the audio amplifier.

According to the present disclosure, a power supply circuit arrangement is provided that provides electrical power to the input terminal of the voltage regulator circuit. The power supply circuit arrangement comprises a switched-mode operated power supply. This circuit includes a switch and an inductor coupled in series with the switch to transform the voltage at an input terminal to a lower voltage at an output terminal in dependence on a clock signal that operates the switch. The input of the switched-mode power supply (SMPS) circuit may be connected to a battery power supply which has a wide range of output voltage depending on its charging state. According to this disclosure, the switched-mode power supply circuit is configured to generate at least two different levels of output voltage in dependence on the level of the supply voltage that may be battery powered.

The voltage regulator circuit is configured such that it supplies a voltage at its output terminal that depends on the level of the output voltage of the switched-mode power supply circuit. The voltage regulator circuit is configured to provide an output voltage that is switchably controlled in dependence on the level of the output voltage supplied by the switched-mode power supply circuit.

In operation, when the battery charge state is high, the switched-mode power supply circuit down-converts its relatively high input voltage to a relatively high output voltage level. The voltage regulator circuit generates a relatively high output voltage therefrom to supply the audio amplifier. When the battery charge state is low and the input voltage to the switched-mode power supply circuit is low, its down-converted output voltage is at a relatively low output voltage level. The voltage regulator circuit is switched such that it also generates a relatively low output voltage.

In terms of power dissipation, it is to be noted that the power consumption in the switched-mode power supply is almost not dependent from the voltage difference between its input and output terminals. For high power and low power operational modes, the power dissipation in the switched-mode power supply circuit is approximately the same. The operation of the voltage regulator circuit is switched between high power and low power mode to ensure that only a reasonable amount of voltage drops across the voltage regulator circuit.

When the voltage regulator circuit receives a high input voltage, the regulated output voltage is switched to be high so that only a reasonable voltage drop occurs at the voltage regulator circuit and the power dissipation in the voltage regulator circuit is only reasonable. This has the advantage that the audio amplifier is operated at a high voltage so that the signal swing at the amplifier is large and the distortion level of the audio signal is low. Instead, the voltage increase at the audio amplifier is used to increase the signal quality of the audio signal output from the audio amplifier.

The power supply circuit arrangement comprises a monitoring circuit to monitor the level of the supply voltage which may be supplied from a battery. Such a battery energy monitor circuit is usually available for other reasons in smart electronic devices such as laptops, smartphones or tablets. The information from the battery monitoring circuit is used to control the clock signal of the switched-mode power supply circuit. If the battery power is high, the switched-mode power supply circuit generates a higher output voltage, and if the battery power is low, the switched-mode power supply circuit generates a lower output voltage. The switch in between two or more output voltages of the switched-mode power supply circuit can be easily obtained by changing the duty cycle of the clock signal. The duty cycle is the ratio between the active phase of the clock signal relative to the full period of the clock signal. A low duty cycle means that the active phase of the clock signal is small relative to the full period of the clock signal, and a high duty cycle means that the active period of the clock signal is larger.

The voltage regulator circuit in one of the microphone circuits is configured to provide an output voltage that can be switchably controlled in dependence on a control signal. The control signal may be generated by a voltage detector that monitors the voltage supplied to the voltage regulator circuit and determines whether the input voltage to the voltage regulator circuit is higher or lower than a threshold. If the supply voltage is high or higher than the threshold, the voltage regulator circuit is switched such that the output voltage is high. If the voltage to the voltage regulator circuit is low or lower than the threshold, the output voltage is correspondingly switched to a lower level. This ensures that only a reasonable voltage drops at the voltage regulator circuit so that only little power is dissipated in the voltage regulator circuit. The switching of the output voltage of the voltage regulator circuit in dependence on the output voltage from the switched-mode power supply, which is the input voltage to the voltage regulator circuit, avoids a too large voltage drop at the voltage regulator circuit and avoids a too large power dissipation in the voltage regulator circuit. A higher output voltage of the voltage regulator circuit increases the signal swing at the audio amplifier and achieves a low distortion mode of the audio signal output from the microphone circuit.

The switched-mode power supply circuit may be realized as a buck converter circuit. A buck converter power supply as such is well-known to a skilled artisan. A buck converter basically comprises a switch transistor at its input side coupled to the input terminal of the converter and an inductor connected in series with the switch transistor and coupled to the output side or the output terminal of the converter. A diode device is connected to the node between the switching transistor and the inductor. Other elements are also useful such as a smoothing capacitor at the output side. The input terminal of the buck converter is connected to the power supply of the system that may be a battery supply.

The voltage regulator circuit is configured as a low-dropout (LDO) regulator that can be switched between at least two output voltage modes in dependence on a control signal. The low-dropout regulator circuit includes the controlled path of a transistor between the voltage input and the voltage output terminals. A feedback loop uses the output voltage to control an error amplifier and control the conductivity state of the transistor. According to the present disclosure, the feedback loop includes switchable voltage dividers connected to the output terminal of the voltage regulator circuit and one of the input terminals of the error amplifier. Depending on the to be generated output voltage either one of the voltage dividers is enabled. Each voltage divider includes a switch that is controlled by the voltage detector that monitors the output voltage of the switched-mode power supply. The voltage divider arrangement is configured such that a high output voltage of the low-dropout regulator is generated when its input voltage is high and a low output voltage is generated when the input voltage is low.

The present solution is particularly useful for a microphone array when multiple microphone circuits are disposed in close vicinity to each other in order to achieve a directionality of the reception of sound. Several, such as three to five, microphones may be arranged in an array to realize suitable directionality. Depending on the field of application, the array may include up to 10 or 20 microphones. The power consumption of the individual microphone circuits becomes an important issue in an array. Preferably, all microphone circuits of the array are identical and include MEMS microphone transducer, audio amplifier, voltage regulator circuit and voltage detector, wherein the inputs of voltage regulator circuit and voltage detectors are coupled to the output of the buck converter. The output signals of the audio amplifiers are forwarded to a summing node that combines the audio output signals to a composite output signal that can be further processed by the signal processing means in the electronic equipment.

The solution described in the present disclosure is useful for mobile equipment such as mobile communication and computing devices such as laptops, smartphones or tablets. Applications in other fields that require the reception of sound, the recognition of speech and the recognition of individual speakers are also useful.

BRIEF DESCRIPTION OF THE DRAWINGS

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments.

In the drawings.

DETAILED DESCRIPTION OF ILLUSTRATIVE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure. The same elements in different figures of the drawings are denoted by the same reference signs.

Figure 1:
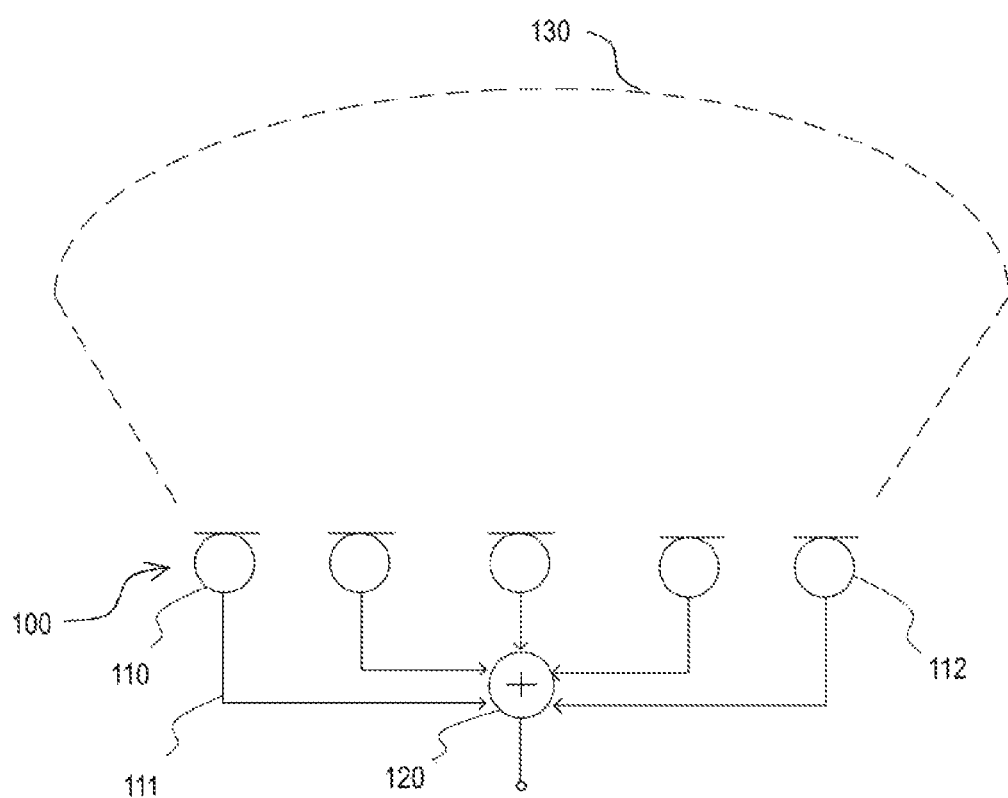
FIG. 1 shows a principle diagram of a microphone array.

FIG. 1 shows a principle block diagram of a microphone array 100. The array comprises an exemplary number of five individual microphone circuits 110 through 112 that are disposed in a 1D, 2D or 3D relation to each other. The microphone circuits such as 110, 112 generate an audio output signal at an output terminal such as 111. All audio signals from the microphone circuits 110 through 112 are combined in a summing node 120. The output of the summing node 120 is forwarded to a signal processor to perform subsequent operations on the combined audio signals. While one individual microphone such as 110 usually has an omnidirectional pickup response, which means that it responds equally to sounds coming from any direction, multiple microphones arranged in array fashion form a directional response or a beam pattern such as depicted sound receiving region 130. A beam-forming microphone array can be designed to be more sensitive to sound coming from one or more specific directions than sound coming from other directions. This function is useful for distant voice recognition functions in smart electronic devices such as laptops, smartphones or tablets. In the exemplary linear arrangement shown in FIG. 1, the soundwaves from the broad side of the array depicted as sound receiving region 130 are preferably picked up. The number of microphones in the array can be varied, e.g., from 3 to 10 or 20 or even more microphones disposed in a linear or 2D or 3D arrangement.

Figure 2:
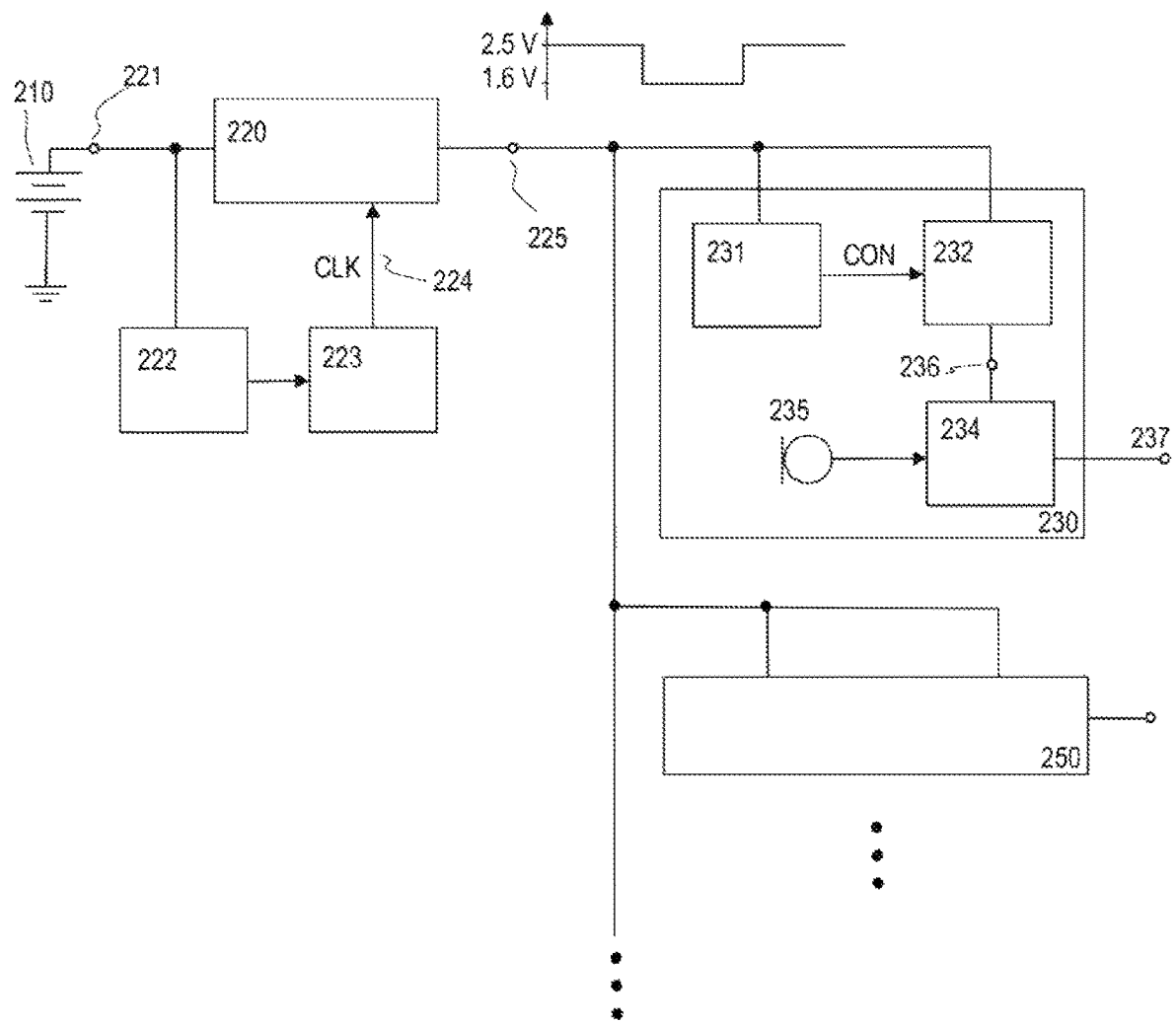
FIG. 2 shows a more detailed block diagram of the microphone array according to the principles of this disclosure.

FIG. 2 shows a block diagram of a microphone array according to the principles of this disclosure. The microphone array includes a multitude of microphone circuits of which exemplary microphone circuits 230, 250 are depicted. Each microphone circuit 230, 250 is configured identically. Microphone circuit 230 includes a MEMS transducer 235 that generates an electrical audio output signal that is forwarded to an audio amplifier 234. Amplifier 234 generates an audio output signal at terminal 237 forwarded to the audio summing node 120. The supply power for amplifier 234 is provided by voltage regulator circuit 232 that may be a low-dropout (LDO) regulator 232 described in more detail herein below. LDO regulator 232 receives an input voltage generated by a switched-mode power supply (SMPS) circuit 220. The system is powered by a battery power supply 210 that provides a highly variable output voltage to the input terminal 221 of SMPS 222. The voltage supplied by battery 210 depends on the charge state of the battery and may vary from about 3.6 V when fully charged to about 1.64 V when little charged. The SMPS 220 is operated clockwise and generates a down-converted constant output voltage at its output terminal 225 so that the LDO regulator 232 further regulates that voltage down to a suitable supply voltage for the audio amplifier 234.

The SMPS 220 converts the voltage from input terminal 221 down to a lower voltage at output terminal 225. The operation of SMPS 220 is controlled by a clock signal CLK at clock terminal 224. A monitoring circuit 222 monitors the battery voltage at input terminal 221 and determines whether the voltage from battery 210 is high or low. Specifically, monitoring circuit 222 compares the voltage from battery 210 with a threshold value to determine whether a high or a low battery voltage is present. Monitoring circuit 222 is commonly present in a battery powered device as a built-in standard battery energy monitor module. The determination signal generated by monitoring circuit 222 is forwarded to a control circuit 223 that generates the clock signal CLK. The clock signal control circuit 223 may be realized in a standard microcontroller module that is commonly present in smart communication or computing devices.

If the output signal from monitoring circuit 222 indicates a high battery voltage, the clock signal CLK is controlled such that the output voltage of SMPS 220 at output terminal 225 is relatively high. If the signal from monitoring circuit 222 indicates that the battery voltage is low, the clock signal CLK is controlled such that the output voltage at terminal 225 is lower. The clock signal CLK has either a high duty cycle to generate the high output voltage or a low duty cycle to generate the lower output voltage. Suitable output voltages may be about 2.5 V for the high output voltage and 1.6 V for the lower output voltage. Other voltages are also possible depending on the system requirements. Since the voltage at output 225 is forwarded to the voltage control circuits 231 of the microphone circuits 230, 250, it is acceptable that the output voltage from SMPS 220 varies slightly about the high or low target value. The output voltage at terminal 225 may include a ripple as the operation of SMPS 220 is clock-driven. The voltage regulator circuits 232 in the microphone circuits filter out the ripple and supply a constant regulated voltage at a defined level to the amplifiers 234.

Each of the microphone circuits 230, 250 includes a voltage detector 231. The voltage detector 231 detects whether the high, e.g., 2.5 V, or the low, e.g., 1.6 V, output voltage from the SMPS 220 is provided. The voltage detector 231 may be a comparator that compares the output voltage from SMPS 220 with a threshold to determine whether a high or a low voltage is present. The threshold may be, e.g., at 2 V. The output signal from voltage detector 231 is forwarded to the LDO voltage regulator 232. The LDO regulator 232 is switchable in that it outputs a high, e.g., 2.3 V, or a low, e.g., 1.4 V, output voltage to amplifier 234 depending on the output signal from voltage detector 231, the latter depending on the high or low output voltage of SMPS 220. The output voltages of SMPS 220 at terminal 225 and LDO regulator 232 at terminal 236 as well as control signal CON at the output of voltage detector 231 are summarized in the table as follows:

| Battery voltage | Output voltage of SMPS 220 | Clock signal CLK | Output voltage of LDO 232 | Control signal CON |
|---|---|---|---|---|
| >2.5 V | 2.5 V | High duty cycle | 2.3 V | 1 |
| <2.5 V | 1.6 V | Low duty cycle | 1.4 V | 0 |

In terms of power dissipation, it is to be noted that SMPS 220 realized as a buck converter consumes relatively little operating power so that the losses of the voltage conversion at SMPS 220 are low, in the range of 10% or lower than 10% and the efficiency is high in the range of 90% or more, which is substantially independent from the voltage difference between input and output voltages at terminals 221, 225.

The power dissipation in LDO regulator 232 depends on the voltage drop at the regulator 232. Since the output voltage at LDO regulator 232 is switched between high and low output voltage in dependence on the level of the input voltage, it can be assured that the voltage drop at LDO regulator 232 is low, e.g., 0.2 V, and not excessively high as in conventional systems. The audio amplifier may consume a current of about 200 µA so that the power dissipation at the LDO regulator 232 for the high voltage and the low voltage modes can be calculated as follows:

$(2.5-2.3)\ V*200\ \mu A = 40\ \mu W$          High output voltage:

$(1.6-1.4)\ V*200\ \mu A = 40\ \mu W$          Low output voltage:

For the sample array of FIG. 1, the power dissipation of five microphones is a total of 5*40 µW=200 µW. Compared to a conventional system in which the voltage drop between the battery voltage and the voltage supplied to the amplifier fully drops at the LDO regulator, the power dissipation in the LDO regulator is much higher and can reach up to about 400 µW for one microphone only when the battery is fully charged. This leads to an almost inacceptable amount of dissipation power for a microphone array of multiple microphones, each dissipating about 400 µW for the LDOs which are converted to heat only.

Overall, the battery monitor circuit 222 determines a high battery voltage so that control circuit 223 generates a clock signal CLK of high duty cycle and SMPS 220 generates a high voltage. This output voltage is determined as a high voltage by voltage detector 231 that generates a control signal CON causing the LDO regulator 232 to output a high output voltage. In the other operational mode, battery monitor circuit 222 determines a low battery voltage so that control circuit 223 generates a low duty cycle clock signal CLK and SMPS 220 generates a low output voltage that is determined by voltage detector 231 causing the LDO regulator 232 to generate a low output voltage.

With the above-described two power modes, the microphone array can be operated with two distortion modes of the audio amplifier 234. When the supply voltage of the system by battery 210 is high, the supply voltage of the audio amplifier 234 at terminal 236 is high so that the audio amplifier benefits from a large signal swing for the audio signal generated by MEMS transducer 235. This reduces the distortion of the audio amplifier so that the audio signal path has a high signal-to-noise ratio and the audio signal at audio output 237 is of a high quality. If the supply voltage from battery 210 is low, the supply voltage at the audio amplifier 234 at terminal 236 is low so that the audio amplifier operates at reasonable distortion mode and the quality of the audio signal at audio output 237 is reasonable. Accordingly, the presently disclosed circuit offers the possibility to operate with two distortion modes having either superior quality or reasonable quality of the output audio signal. This is set automatically by the disclosed circuit in dependence on the output voltage of the battery. It is also conceivable that the switching between the two operation modes can be made manually in that the control circuit 223 receives a corresponding command.

Figure 3:
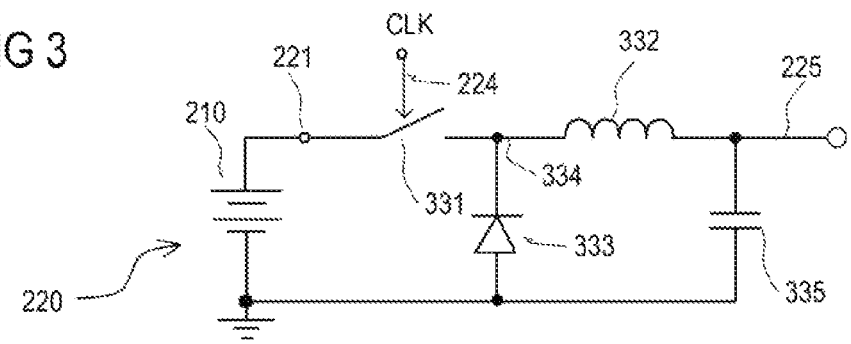
FIG. 3 shows a schematic diagram of a buck converter.

Turning now FIG. 3, an exemplary schematic representation of a buck converter type SMPS 220 is depicted. The buck converter 220 includes a series connection of a switch 331 and an inductor 332. The switch 331 is operated with clock signal CLK at clock input terminal 224. The input terminal of the buck converter is connected to the battery supply 210. The output terminal 225 of the buck converter is connected to the inductor 332. The cathode of a diode 333 is connected to the node 334 between switch 331 and inductor 332. The anode of the diode 333 is connected to ground potential. Other components may be useful in the circuit such as capacitor 335 connected between the output terminal 225 and ground potential to buffer and smooth the output voltage. The clock signal CLK may be controlled in an open or closed loop fashion. While the closed loop configuration may deliver a more stable output voltage, it is more complex. The open loop configuration may also be sufficient since it is acceptable that the output voltage at terminal 225 may vary in a certain range without dissipating too much additional power in the downstream connected LDO regulators.

Figure 4:
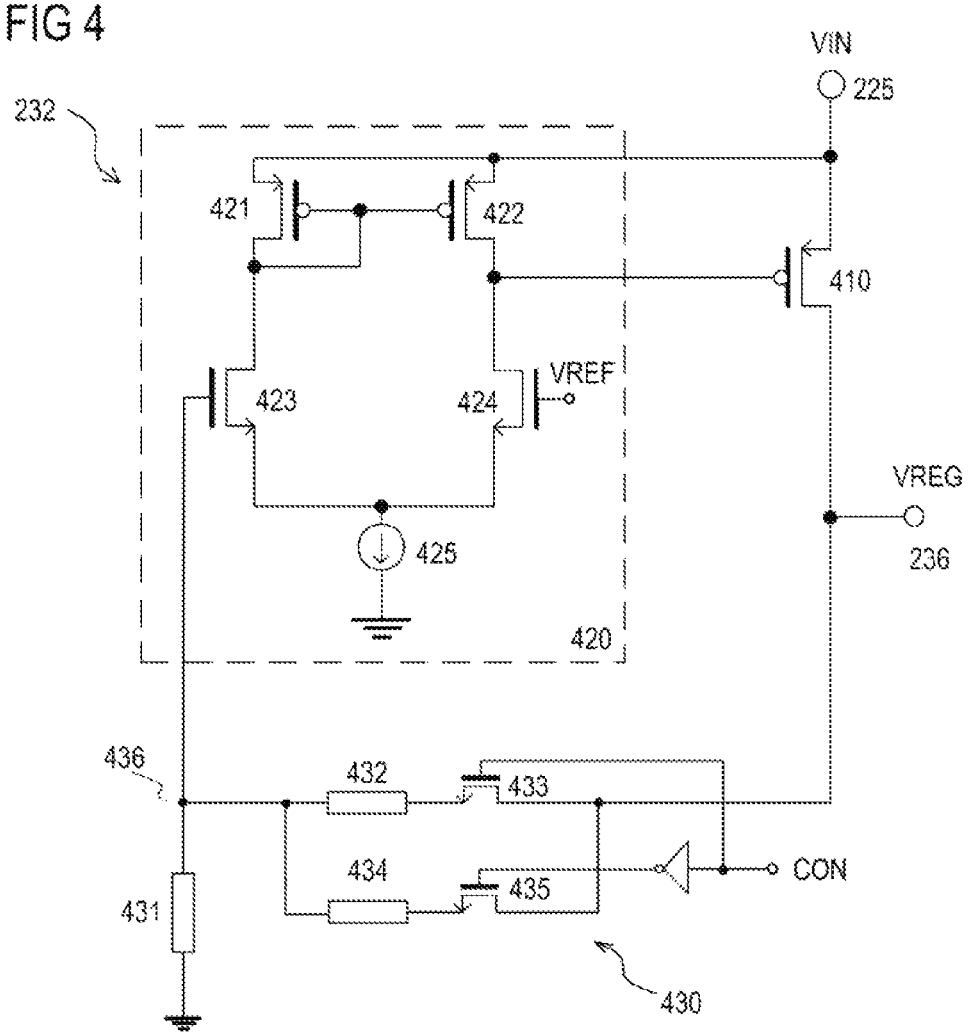
FIG. 4 shows a schematic diagram of a low-dropout regulator according to the principles of this disclosure.

Turning now to FIG. 4, an exemplary schematic representation of a low dropout (LDO) regulator 232 is depicted. The switchably controlled LDO regulator 232 of FIG. 4 comprises a p-channel MOS transistor 410 of which the drain source path is connected between output 236 and voltage input 225. The gate terminal of transistor 410 is controlled by a feedback loop that feeds the output 236 over a switchable resistor divider 430 to an error amplifier or operational transconductance amplifier 420 back to the gate control terminal of transistor 410. The switchable resistor divider 430 comprises two resistor dividers 432, 431 and 434, 431 of which resistor 431 is in common. The resistors 432 and 434 can be alternately enabled by switch transistors 433 and 435, respectively, which are complementarily controlled by control signal CON generated by the voltage detector 231. If signal CON=1, the switch transistor 433 is conductive and resistor divider 432, 431 is enabled. If signal CON=0, switch 435 is conductive so that resistor divider 434, 431 is enabled. The output voltage VREG at terminal 236 in dependence on input voltage VIN at terminal 225 is determined as follows:

| VIN | CON | VREG |
|-----|-----|------|
| 2.5 V | 1 | VREF * (1 + $R_5/R_4$) |
| 1.6 V | 0 | VREF * (1 + $R_6/R_4$) | wherein R4 is the resistance of resistor 431, R5 the resistance of resistor 432 and R6 the resistance of resistor 434.

The voltage obtained at the midpoint 436 of the voltage divider is forwarded to the error amplifier 420. The error amplifier includes a current switch of transistors 423 and 424 connected to current source 425. Transistor 424 is controlled by reference voltage VREF. Transistor 423 is connected to the midpoint 436 of the resistor divider. The load of the current switch includes a current mirror circuit of transistors 421 and 422. In the switchable resistor divider 430, the resistance R5 of resistor 432 is larger than the resistance R6 of resistor 434, R5>R6.

The present disclosure provides a power supply scheme for a microphone array that is power effective and can therefore be used in battery powered electronic devices and systems. It uses a buck converter that consumes only little power and switchable LDO regulators in each of the microphone circuits that have a switched output voltage and, therefore, also consume only reasonable power even if the battery supply of the system delivers a high voltage. The audio signal path can be operated in a high quality and reasonable quality mode.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirit and substance of the disclosure may occur to the persons skilled in the art; the disclosure should be construed to include everything within the scope of the appended claims.

What is claimed is:

1. A microphone array comprising:
   a power supply circuit arrangement comprising:
      a switched-mode power supply circuit comprising an input terminal for a supply voltage, an output terminal for an output voltage and a terminal for a clock signal, the switched-mode power supply circuit configured to generate at least two different levels of the output voltage depending on a level of the supply voltage;
   at least one microphone circuit comprising:
      a microphone transducer having an output terminal; and
      an amplifier having a supply terminal for a supply voltage and an output terminal for an audio signal, the output terminal of the microphone transducer connected to the amplifier; and
   a voltage regulator circuit having an input terminal and an output terminal, the input terminal connected to the output terminal of the switched-mode power supply circuit and the output terminal connected to the supply terminal of the amplifier, wherein the voltage regulator circuit is configured to supply a voltage at the output terminal of the voltage regulator circuit in dependence on the level of the output voltage of the switched-mode power supply circuit.

2. The microphone array according to claim 1, wherein the switched-mode power supply circuit is configured to generate a higher voltage when the supply voltage is higher than a threshold and a lower voltage when the level of the supply voltage is lower than the threshold.

3. The microphone array according to claim 1, wherein the power supply circuit arrangement further comprises a monitoring circuit configured to monitor the level of the supply voltage and a control circuit configured to control the clock signal in response to the level monitored by the monitoring circuit.

4. The microphone array according to claim 3, wherein the control circuit is configured to change a duty cycle of the clock signal to be supplied to the switched-mode power supply circuit depending on a determination made by the monitoring circuit.

5. The microphone array according claim 1, wherein the voltage regulator circuit is configured to provide a voltage at the output terminal switchably controlled depending on a control signal.

6. The microphone array according to claim 1, wherein the voltage regulator circuit is configured to supply a higher voltage at the output terminal of the voltage regulator circuit, when the voltage at the input terminal of the voltage regulator circuit is higher than a threshold, and to supply a lower voltage at the output terminal of the voltage regulator circuit, when the voltage at the input terminal of the voltage regulator circuit is lower than the threshold.

7. The microphone array according to claim 6, wherein the microphone circuit comprises:
a voltage detector coupled to the input terminal of the voltage regulator circuit; and
an output terminal coupled to the voltage regulator circuit to control the level of the output voltage of the voltage regulator circuit.

8. The microphone array according to claim 7, wherein the switched-mode power supply circuit is a buck converter circuit.

9. The microphone array according to claim 8, wherein the buck converter circuit comprises:
an input terminal;
an output terminal;
a switch transistor coupled to the input terminal and having a control terminal controlled by the clock signal;
an inductor coupled in series with the switch transistor and coupled to the output terminal; and
a diode coupled to a node between the switch transistor and the inductor.

10. The microphone array according to claim 9, wherein the clock signal is controlled to exhibit a high duty cycle when the level of the supply voltage is higher than a threshold, and to exhibit a low duty cycle when the level of the supply voltage is lower than a threshold.

11. The microphone array according to claim 1, wherein the voltage regulator circuit is a low-dropout regulator.

12. The microphone array according to claim 11, wherein the low-dropout regulator comprises:
an input terminal for a supply voltage;
an output terminal for an output voltage;
a transistor of which a controlled path is connected between the input and output terminals;
an amplifier having a terminal for a reference voltage and a terminal for a control voltage; and
a first and a second voltage divider coupled between the output terminal of the low-dropout regulator and the terminal for a control voltage of the amplifier, wherein the first and second voltage dividers are configured to be enabled alternately.

13. The microphone array according to claim 12, wherein the first and second voltage dividers of the low-dropout regulator comprise a respective switch and the output of a voltage detector is coupled to the switches.

14. The microphone array according to claim 1, further comprising a plurality of microphone circuits, each microphone circuit comprising a microphone transducer, an amplifier having an input terminal coupled to the microphone transducer and an output terminal for an audio signal, and a voltage regulator circuit, wherein the voltage regulator circuits of the at least one microphone circuit and of the plurality of microphone circuits are coupled to the output terminal for an output voltage of the switched-mode power supply circuit, and wherein the output terminals for an audio signal of the amplifiers of the at least one microphone circuit and of the plurality of microphone circuits are coupled to a summing node for the audio signals.

* * * * *